United States Patent
Shiau et al.

(10) Patent No.: US 7,659,595 B2
(45) Date of Patent: Feb. 9, 2010

(54) EMBEDDED BONDING PAD FOR BACKSIDE ILLUMINATED IMAGE SENSOR

(75) Inventors: Gwo-Yuh Shiau, Hsinchu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 11/778,183

(22) Filed: Jul. 16, 2007

(65) Prior Publication Data

US 2009/0020842 A1    Jan. 22, 2009

(51) Int. Cl.
*H01L 31/224* (2006.01)
(52) U.S. Cl. .................. 257/459; 257/431; 257/448; 257/E31.124
(58) Field of Classification Search ........... 257/431, 257/448, 459, E31.124
See application file for complete search history.

(56) References Cited

U.S. PATENT DOCUMENTS

| | | | |
|---|---|---|---|
| 5,956,569 A | 9/1999 | Shiu et al. | |
| 6,251,724 B1 | 6/2001 | Ku et al. | |
| 6,617,189 B1 * | 9/2003 | Lin et al. | 438/48 |
| 2004/0014308 A1 | 1/2004 | Kellar et al. | |
| 2005/0001318 A1 | 1/2005 | Won | |
| 2005/0176174 A1 | 8/2005 | Leedy | |
| 2008/0246152 A1 * | 10/2008 | Liu et al. | 257/758 |

\* cited by examiner

*Primary Examiner*—Victor A Mandala
(74) *Attorney, Agent, or Firm*—Haynes and Boone, LLP

(57) ABSTRACT

The present disclosure provide a microelectronic device. The microelectronic device includes a sensing element formed in the semiconductor substrate; a trench isolation feature formed in the semiconductor substrate; a bonding pad formed at least partially in the trench isolation feature; and interconnect features formed over the sensing element and the trench isolation feature, being coupled to the sensing element and the bonding pad, and isolated from each other by interlayer dielectric.

17 Claims, 12 Drawing Sheets

EMBEDDED BONDING PAD FOR BACKSIDE ILLUMINATED IMAGE SENSOR

BACKGROUND

In semiconductor technology that processes a backside of a wafer, such as a backside illuminated complementary metal-oxide-semiconductor imaging sensor (CIS) or charge-coupled device (CCD), a carrier substrate typically needs to be bonded to the front side of the wafer. The carrier substrate thereby sandwiches circuitry such as multilayer interconnects between it and the wafer substrate (the imaging sensor wafer). This allows the backside silicon of the imaging sensor wafer to be processed, such as in a chemical-mechanical polish (CMP).

Traditional bonding pads are formed near a top surface of the imaging sensor wafer for use in wafer level test and wire bonding during chip packing. However, when the traditional bonding pad structure is applied to the backside illuminated image sensor application, the formed bonding pads are located between the carrier substrate and the imaging sensor wafer and are difficult to access. Also, additional patterning and etching steps may need to be applied to various silicon layers and interconnection layers before wafer packaging, resulting in higher manufacturing and testing cost and other quality issues.

Therefore, the application and use of bonding pads, such as in a backside illuminated sensor, is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
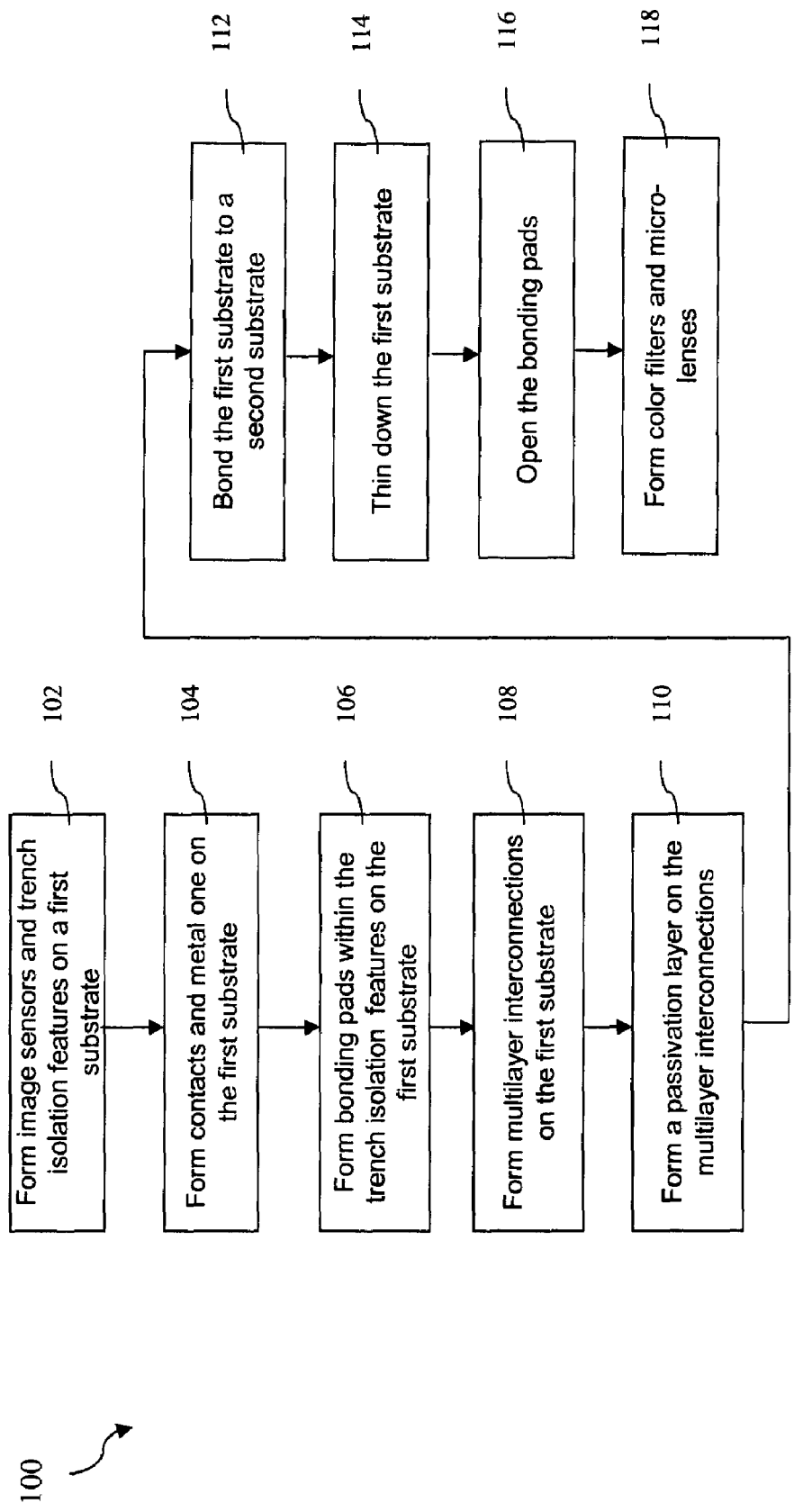
FIG. 1 is a flowchart of one embodiment of a method to form an integrated circuit (IC).

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 to form an integrated circuit. FIGS. 2 through 10 illustrate sectional views of an exemplary integrated circuit 200 during various fabrication stages according to the method 100. With reference to FIGS. 1 through 10, the method 100 and the exemplary integrated circuit 200 are collectively described below. It is understood that additional steps can be provided before, during, and after the method 100, and some of the steps described below can be replaced or eliminated, for additional embodiments of the method.

Figure 2:
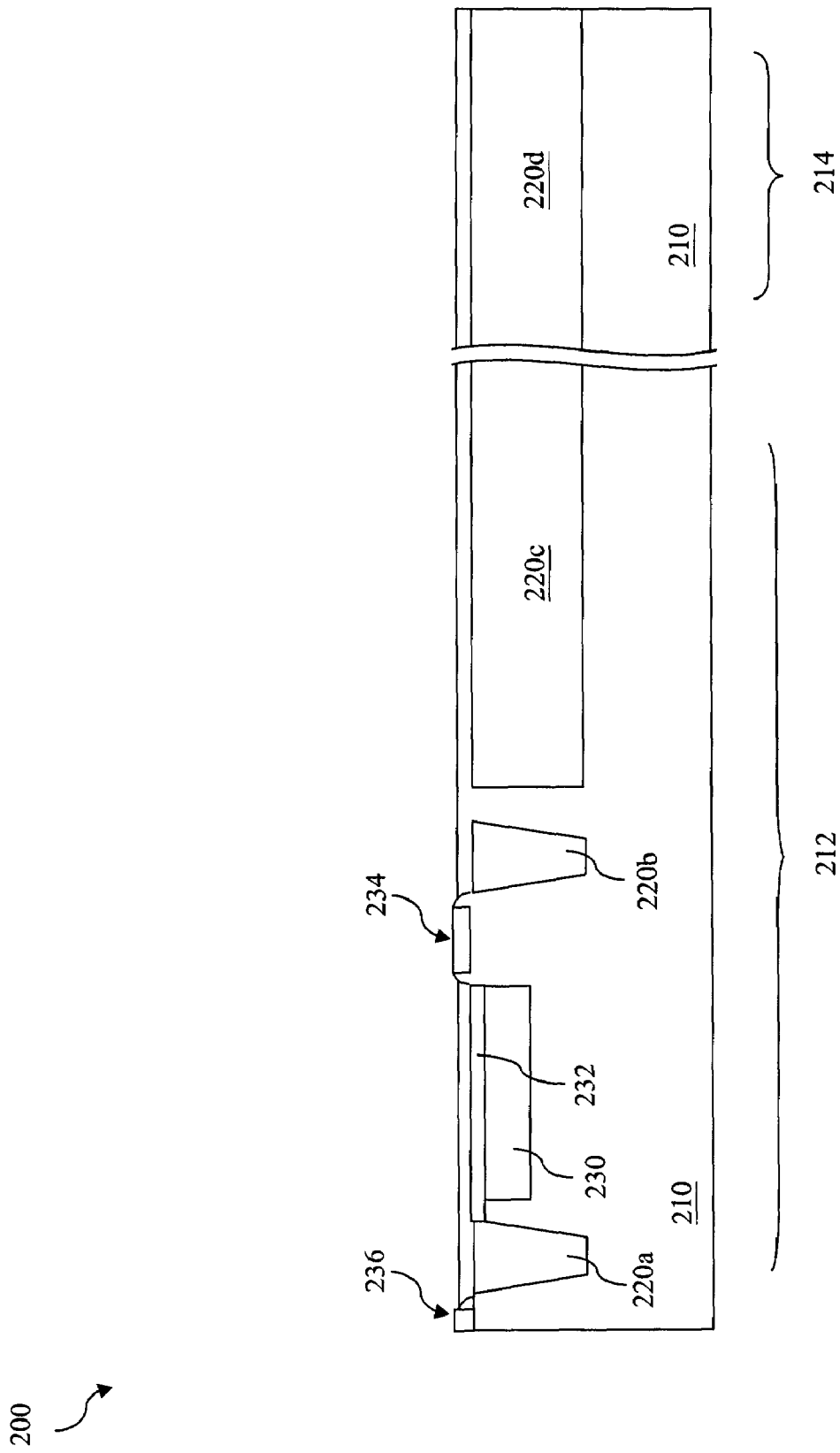
FIGS. 2 through 10 illustrate sectional views of an exemplary integrated circuit during various fabrication stages, made by the method of FIG. 1.

Referring to FIGS. 1 and 2, the method begins at step 102 by forming imaging sensors and trench isolation features on a first substrate 210. In one embodiment, the substrate 210 includes an integrated circuit area 212 to form various integrated circuit devices, and a test region 214 disposed in scribe lines and frame areas for testing and monitoring during and/or after the fabrication thereof. The first substrate 210 is a semiconductor wafer such as silicon wafer. Alternatively, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer, such as an enhancement layer, overlying a bulk semiconductor. Furthermore, the substrate 210 may include a semiconductor-on-insulator (SOI) structure. For example, the substrate may include a buried oxide (BOX) layer formed by a process such as separation by implanted oxygen (SIMOX).

The substrate 210 further includes lateral isolation features disposed to separate various devices formed on the substrate 210. Various isolation features are formed in the substrate 210 to define various active regions and isolate them from each other. In one embodiment, shallow trench isolation (STI) structures, such as STI 220a and 220b, are formed in the substrate 210. A STI structure includes a trench formed in the substrate 210 and filled with proper dielectric material for isolation. The shallow trench isolation (also referred to as trench isolation) structures may have a thickness ranging between about 100 nanometer and 1 micron. Alternatively, the STI structure may have a thickness up to about 6 micron. One method of forming a STI structure includes etching a trench in the substrate and then filling the trench by dielectric materials such as silicon oxide. The trench may have a multilayer structure such as a thermal oxide liner layer and a thick silicon oxide filled the trench. In furtherance of the embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to remove the nitride layer. Alternatively or collectively, the STI structure may use other proper dielectric materials such as silicon nitride, silicon oxynitride, air, or combinations thereof.

Large trench isolation structures such as trench isolation features 220c and 220d are also formed in the substrate 210 and positioned and configured for forming various bonding pads there within. For example, the large trench isolation structure 220c is disposed in the integrated circuit area 212 and the large trench isolation feature 220d is disposed in the test region 214. A large trench isolation structure may have proper dimensions large enough such that a bonding pad can be at least partially embedded therein. In one example, a large trench isolation structure has a horizontal dimension ranging between about 20 micron and 200 micron when viewed in a direction perpendicular to the substrate 210. In one embodiment, the large trench isolation structures 220c and 220d may have a thickness similar to that of the STI structures 220a and 220b, and can be formed along with the STI structures using a common processing sequence. In another embodiment, the large trench isolation structures 220c and 220d may have a different thickness than that of the trench isolation structures 220a and 220b, and may be formed by a different processing sequence.

The substrate 210 includes various p-type doped regions and/or an n-type doped regions, implemented by a process such as ion implantation and/or diffusion. These doped regions in the substrate 210 provide various functional devices or features such as metal-oxide-silicon (MOS) transistor, an imaging sensor, other active features, passive features, or combinations thereof. In one embodiment, a sensing element is formed on the substrate 210 having various doping regions configured to provide particular sensing function. In one example, an imaging sensor is formed on the substrate 210. In furtherance of the example, formed thereon is a pinned photodiode having a first doping region 230 and a second doping region 232. The first doping region 230 includes a first type of dopant opposite to the type of dopant of the substrate 210. The second doping region 232 includes a second type of dopant which is the same as the type of dopant of the substrate 210. In another example, the second doping region 232 is laterally extended beyond the first doping region 230 to contact the substrate 210.

Other devices and features can be formed on the substrate 210. For example, an exemplary transistor 234 may be formed on the substrate 210 adjacent and coupled with the imaging sensor (230 and 232). Another exemplary transistor 236 is formed on the substrate 210. Other devices may includes various transistor, various active and passive features configured and coupled to provide proper functions such as imaging and/or sensing.

Figure 3:
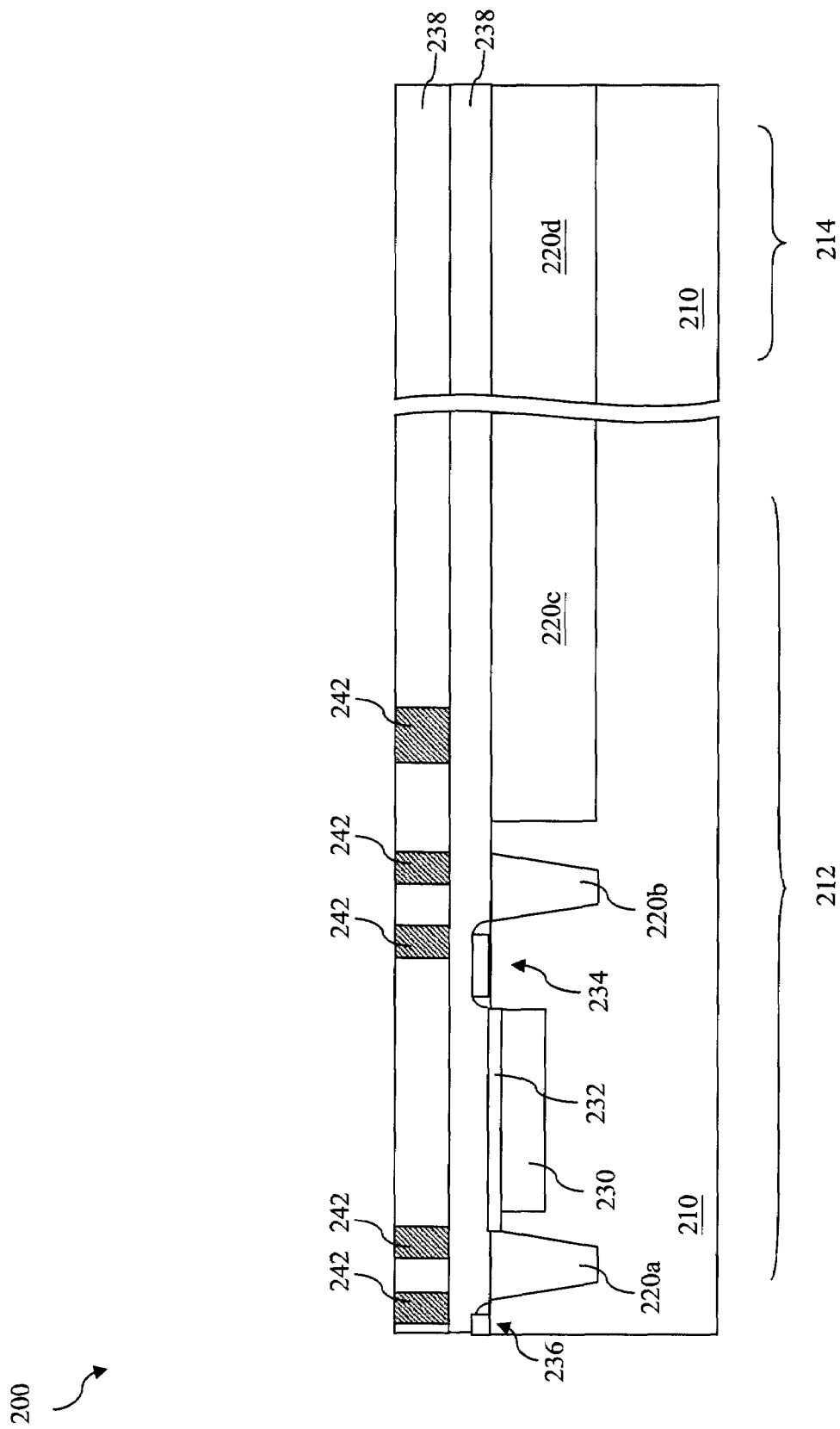

Referring to FIGS. 1 and 3, the method 100 proceeds to step 104 by forming contacts and metal one patterns on the first substrate 210. A plurality of patterned dielectric layers and conductive layers are formed on the substrate 210 to form a portion of the multilayer interconnects configured to couple the various p-type and n-type doped regions, such as the first doping region 230 and the second doping region 232, and other functional features such as the transistors 234 and 236.

In one embodiment. a portion of an interlayer dielectric (ILD) and a multilayer interconnect (MLI) structure are formed in a configuration such that the ILD separates and isolates each from other MLI structures. In furtherance of the example, dielectric material layer(s) 238 and contacts/metal one patterns 242 are formed on the substrate 210. The contacts (not shown in FIG. 3) are configured to couple active regions in the substrate 210 to the various features of the metal one patterns 242. The contacts and metal one patterns may include various proper conductive materials. For example, the contacts may include tungsten formed by a method known in the art. In another example, the metal structure, such as contacts and/or metal one patterns, may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form the metal silicide. Alternatively, a copper multilayer interconnect may be used to form the metal one patterns and/or contacts. The copper interconnect structure may include copper, copper alloy, titanium, titanium nitride, tantalum, tantalum nitride, tungsten, polysilicon, metal silicide, or combinations. The copper interconnect may be formed by a technique including CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

In one embodiment, the dielectric layer 238 includes silicon oxide. In another embodiment, the dielectric layer 238 includes a material having a low dielectric constant such as a dielectric constant less than about 3.5. In another embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes. The metal structures 242 and dielectric layer 238 may be formed in an integrated process such as a damascene process or lithography/plasma etching process.

In a damascene process, copper is generally used as conductive material for interconnection. Other conductive materials include tungsten, titanium, and titanium nitride. Accordingly, silicon oxide, fluorinated silica glass, or low dielectric constant (k) materials can be used for inter-level dielectric (ILD). Chemical mechanical polishing (CMP) processing is implemented afterward to etch back and globally planarize the substrate surface. The CMP process involves both mechanical grinding and chemical etching in a material removal process. In one embodiment, additional dummy metal features may be formed along with other metal features in order to improve chemical mechanical polishing (CMP) performance, global substrate surface flatness, and wafer bonding quality.

Figure 4:
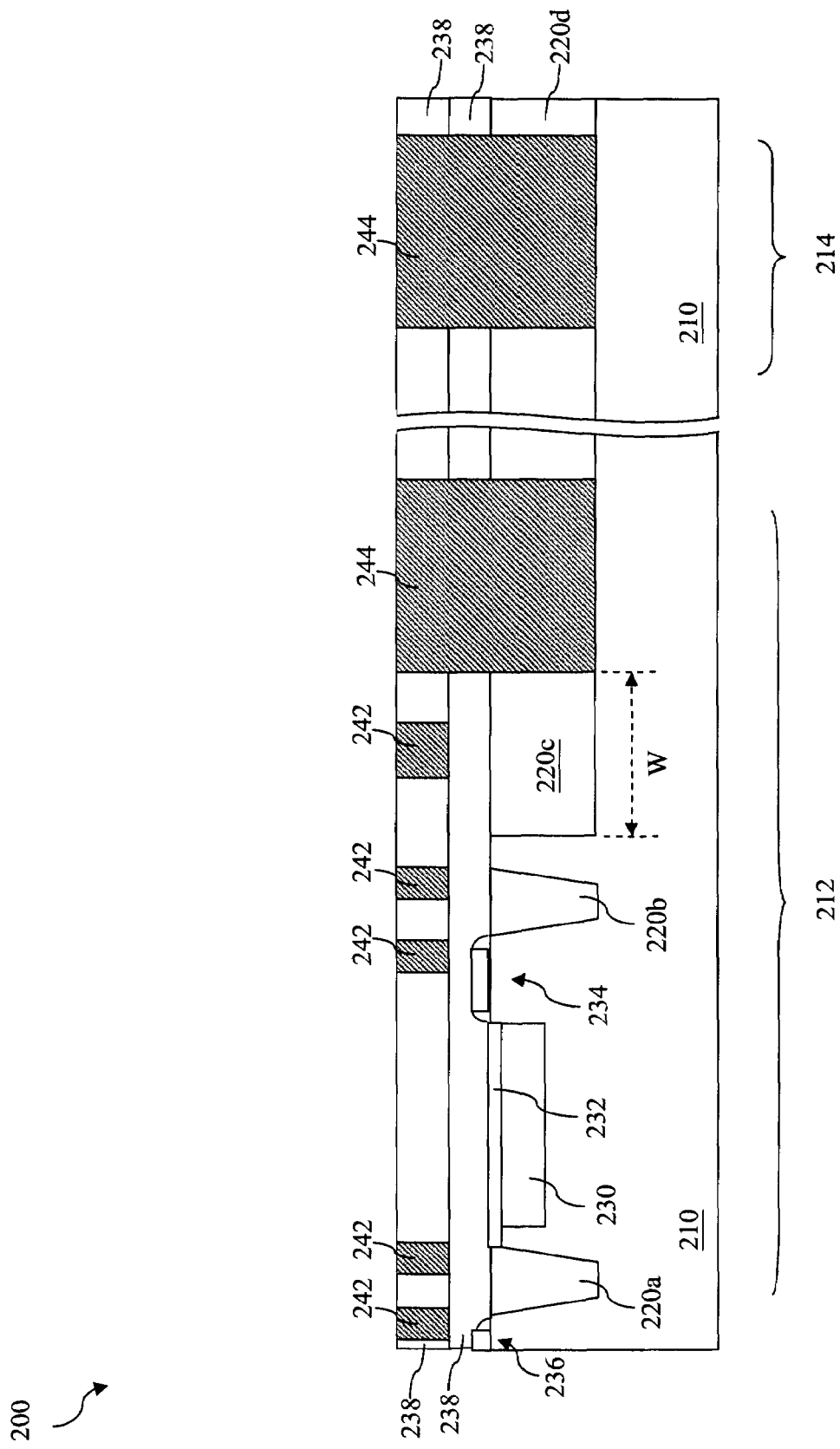

Referring to FIGS. 1 and 4, the method proceeds to step 106 by forming bonding pads 244 at least partially embedded in the trench isolation features on the first substrate 210. For example, the bonding pads 244 each are partially embedded in the large trench isolation structures 220c and 220d, respectively. Each of the bonding pads 244 is designed and positioned within a large trench isolation structure when viewed in a direction perpendicular to the first substrate 210. Furthermore, each sidewall of the bonding pad embedded in a large trench isolation structure has a distance to the outline of the large trench isolation, such as "W" as illustrated in FIG. 4, in order to be separated and isolated from the substrate by the dielectric material of the large trench isolation. Therefore, the bonding pads are less than the associated trench isolation structure in horizontal dimensions. In one embodiment, the bonding pads has a horizontal dimension ranging between about 20 micron and about 200 micron, for proper on-chip testing and chip bonding.

The large trench isolation structure with the bonding pad embedded therein may be extended vertically deeper in the substrate 210 than the other trench isolation structures (such as 220a and 220b), such that the embedded bonding pad can be properly exposed after the substrate 210 is thinned down as described below. For example, the larger trench isolation structure can be as thick as up to about 6 micron. The bonding pad can be completely embedded in a large trench isolation structure. Alternatively, the bonding pad is also partially embedded in an interlayer dielectric structure to be formed overlying the various trench isolation structures. In one example, the bonding pad is formed and extended to a level of the metal one layer 242 as illustrated in FIG. 4. In various other embodiments, the bonding pad may be extended up to various metal layers for proper bonding pad configuration. For example, the bonding pad is extended beyond the trench isolation structure and reaches up to the contact level such that metal one layer can be patterned to directly contact the bonding pad as contact the contacts. In other examples, the bonding pad may be extended beyond the trench isolation structure and be able to reach one of the metal layers, such as metal two, metal three or higher metal layer, of the multilayer interconnects for proper electrical routing. Therefore, the bonding pad may be formed after the formation of the one metal layer, to which the bonding pad is substantially extended to, or formed during a process sequence integrated with the formation of the one metal layer.

In another example, the bonding pad can be formed in a processing sequence similar to those of the multilayer interconnect structures. For example, the bonding pad includes copper and is formed by a damascene process. During the damascene process, the trench isolation and other dielectric material (such as interlayer dielectric material overlying the trench isolation) are opened to form a trench. A conductive material is filled in the trench and a CMP process (or other process such as an etching back process) is applied to remove excess conductive material and planarize the substrate. In another embodiment, the formation of the bonding pad can be at least partially integrated with the formation of contacts, metal one patterns, or multiple metal layers of the MLI structure. The bonding pad may have multiple layer structure such as a barrier layer lining the trench and a metal layer filling in the trench. The conductive material of the bonding pad includes aluminum or aluminum alloy. Alternatively, the conductive material of the bonding pad may include other metals, metal alloys, metal silicides, or combinations thereof.

Figure 5:
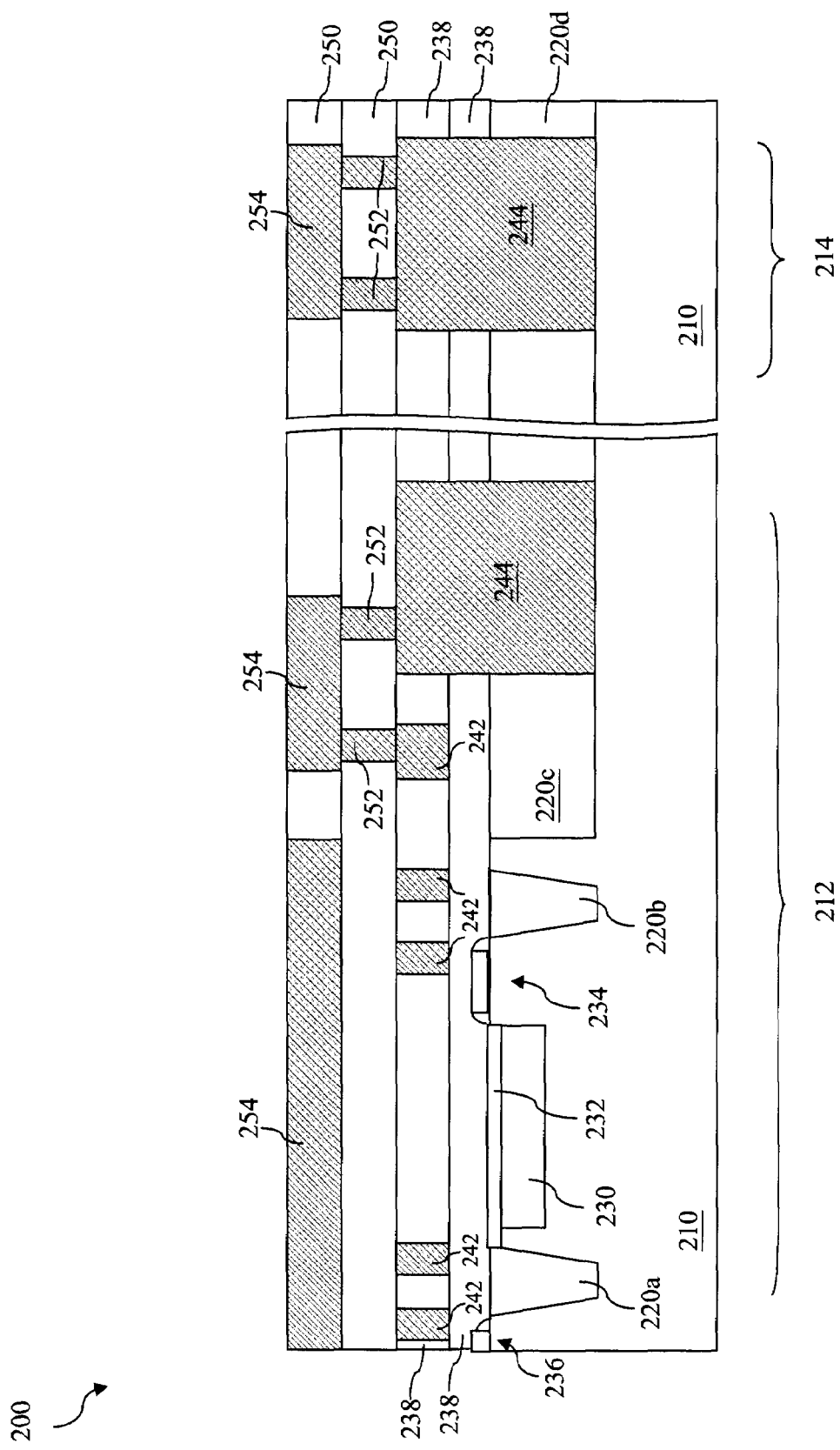
Figure 6:
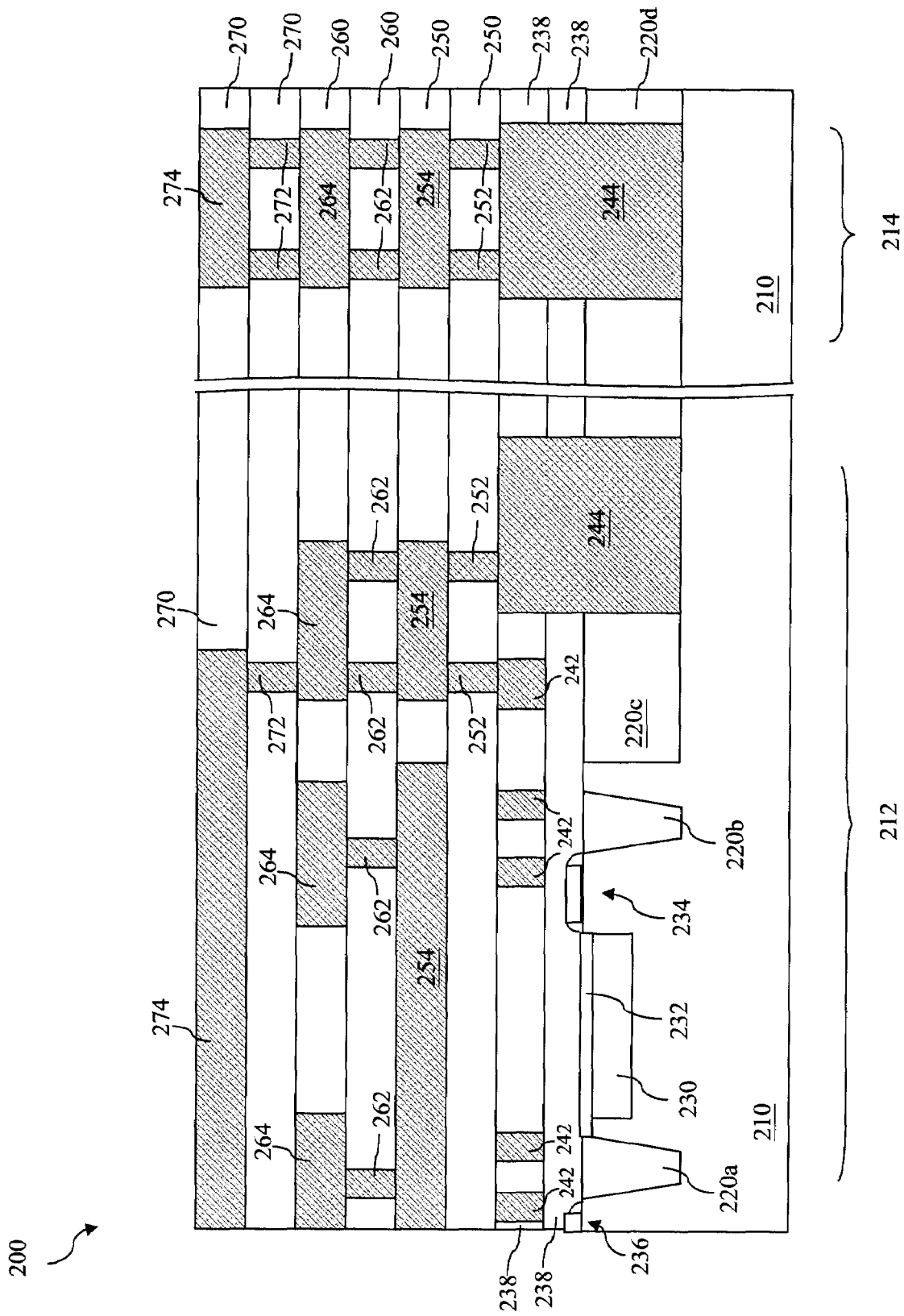

Referring to FIGS. 1, 5 and 6, the method 100 proceeds to step 108 by forming the multilayer interconnects on the first substrate 210. At step 108, the rest of the MLI and ILD are formed after the formation of the bonding pads 244. For example, the metal two patterns, including vias 252 and metal lines 254, are formed overlying the metal one layer, as illustrated in FIG. 5. The metal two patterns is substantially similar to the metal one patterns in terms of formation, composition and configuration. Other metal layers and the top metal layer are formed overlying the metal two layer, as illustrated in FIG. 6, substantially similar to the metal one patterns in terms of formation, composition and configuration. For example, the metal three patterns include vias 262 and metal lines 264, and the top metal layer patterns include vias 272 and metal lines 274. Additional metal layers may be included and formed similarly if necessary. Various interlayer dielectric layers, such as dielectric layers 260 and 270 as illustrated in FIGS. 5 and 6, can be formed around the multilayer metal vias and lines to isolate thereof.

In one embodiment, the top metal layer is formed to have a plurality of top metal features such as 272 and 274. The top metal features 272 and 274 may include aluminum, aluminum/silicon/copper alloy, copper, titanium, titanium nitride, tungsten, or combinations as used in conventional aluminum process or copper damascene process technologies. The top metal layer may be deposited by sputtering, plating, chemical vapor deposition (CVD), or combinations thereof. Other manufacturing processes, including photolithography and etching, may be used to pattern the metal material to form the plurality of top metal features. In another embodiment, dummy metal features may be formed along with the formation of the top metal features to improve the performance of subsequent CMP processing, which is applied to planarize the surface of the top metal layer.

Figure 7:
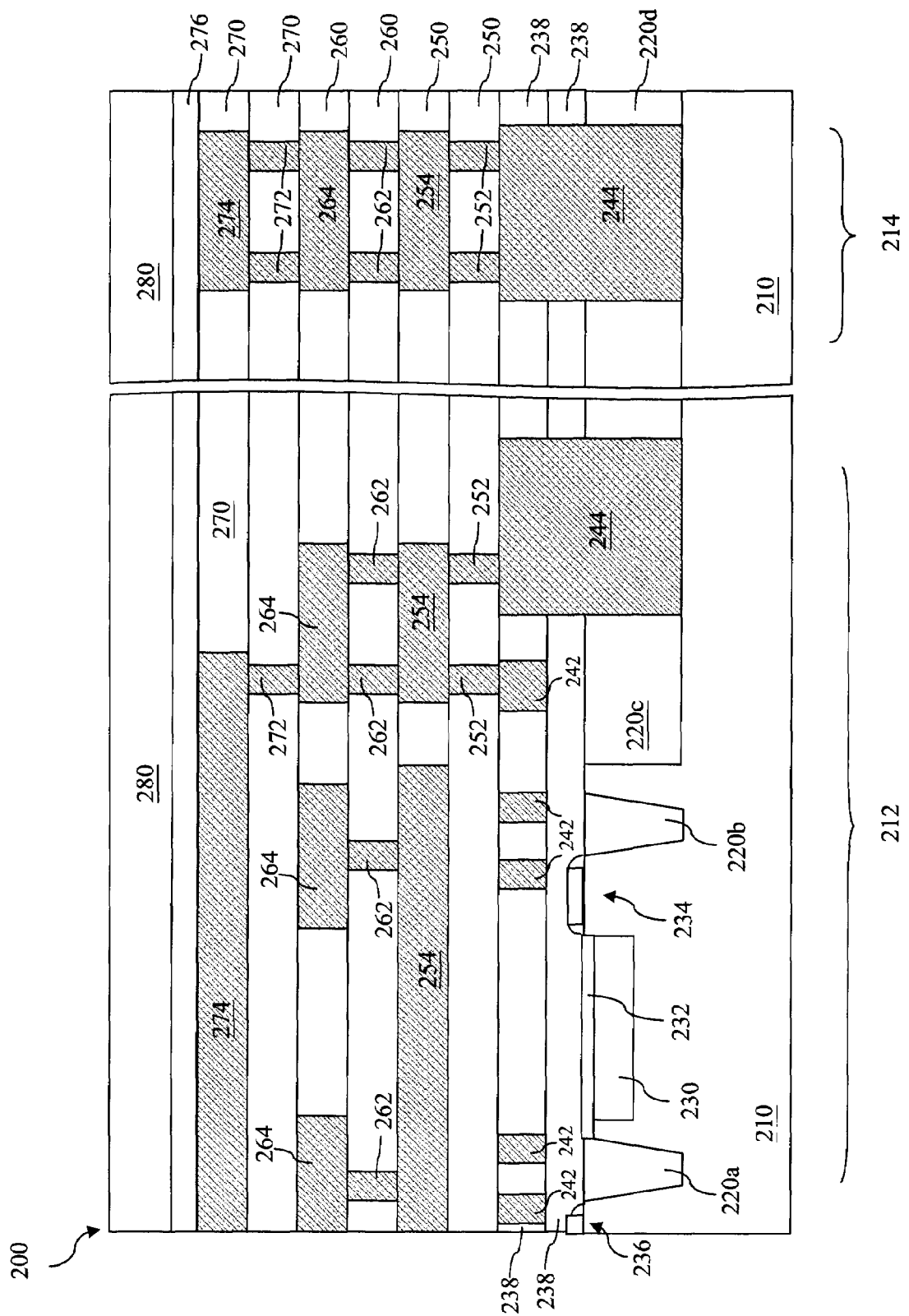

Referring to FIGS. 1 and 7, the method proceeds to step 110 by forming a passivation layer 276 on the top metal layer to cover and protect the multilayer interconnect structure. The passivation layer may include silicon oxide, silicon nitride, silicon oxynitride, or combinations thereof. The passivation layer may include multiple layers for optimized function. In one example, the passivation layer includes one layer of silicon oxide formed on the top metal layer by CVD, spin-coating or other proper techniques, and a layer of silicon nitride formed on the layer of silicon oxide by CVD or other proper techniques. In furtherance of the embodiment, a plasma enhanced chemical vapor deposition (PECVD) is implemented to form the silicon nitride layer.

Still referring to FIGS. 1 and 7, the method proceeds to step 112 by bonding a carrier substrate (sometimes referred to as a second substrate) 280 to the first substrate 210 from the front surface of the first substrate such that the multilayer interconnects are located between the first and second substrates. The carrier substrate 280 can be another semiconductor substrate, a glass substrate or a substrate made of other proper materials. The second substrate 280 is bonded to the first wafer 210 by molecular force. For example, the first substrate is brought to contact the second substrate. Then the two substrates are locally attracted to each other by Van der Waal forces and bonded together. The second substrate 280 may be used to mechanically support and protect the first substrate 210.

Figure 8:
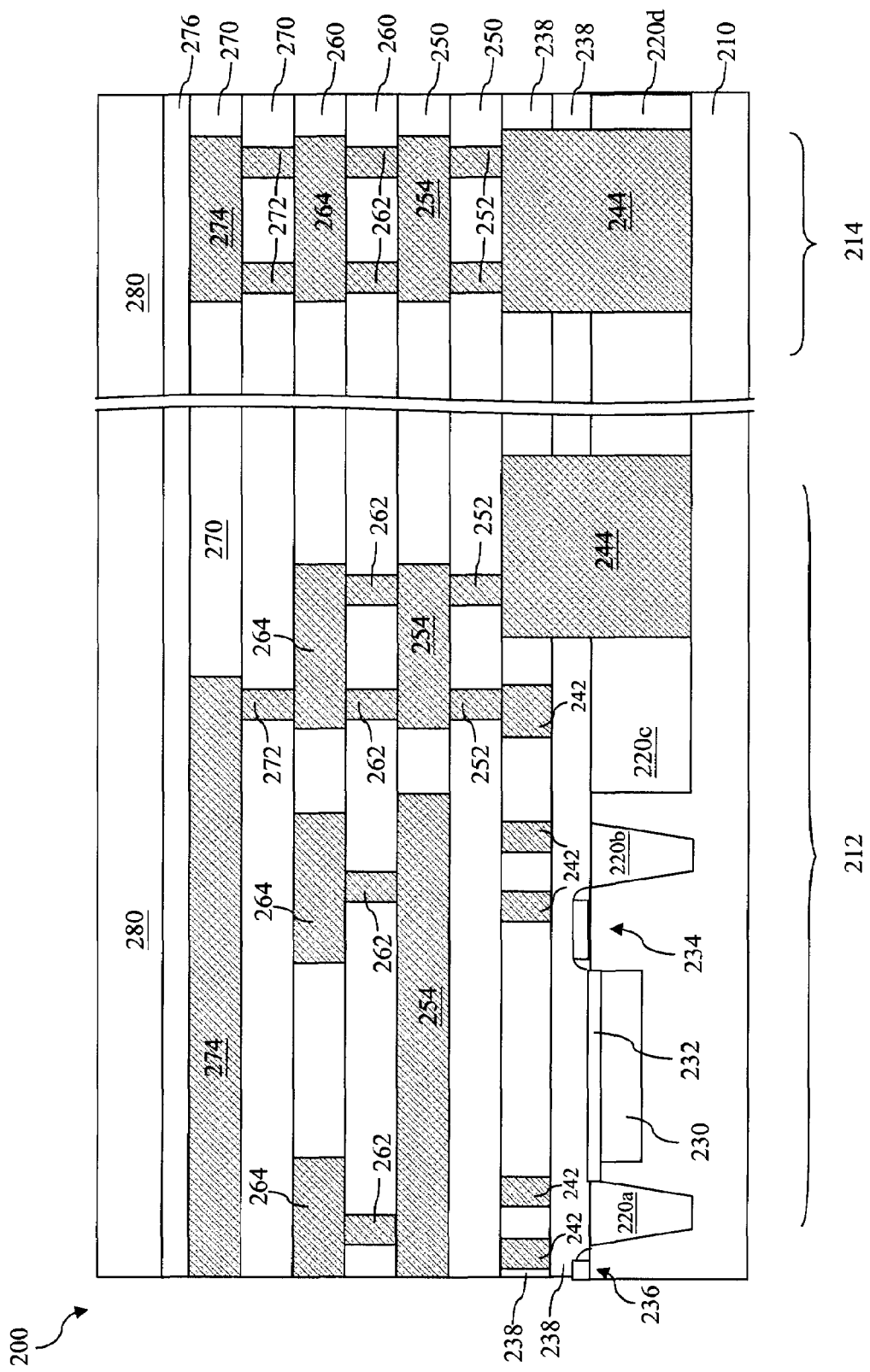

Referring to FIGS. 1 and 8, the method 100 proceeds to step 114 by thinning down the first substrate 210 from the back surface to reduce the thickness of the first substrate in order for proper back side illumination. For example, the first substrate 210 is grinded to reduce the thickness from the backside under the support of the carrier wafer.

Figure 9:
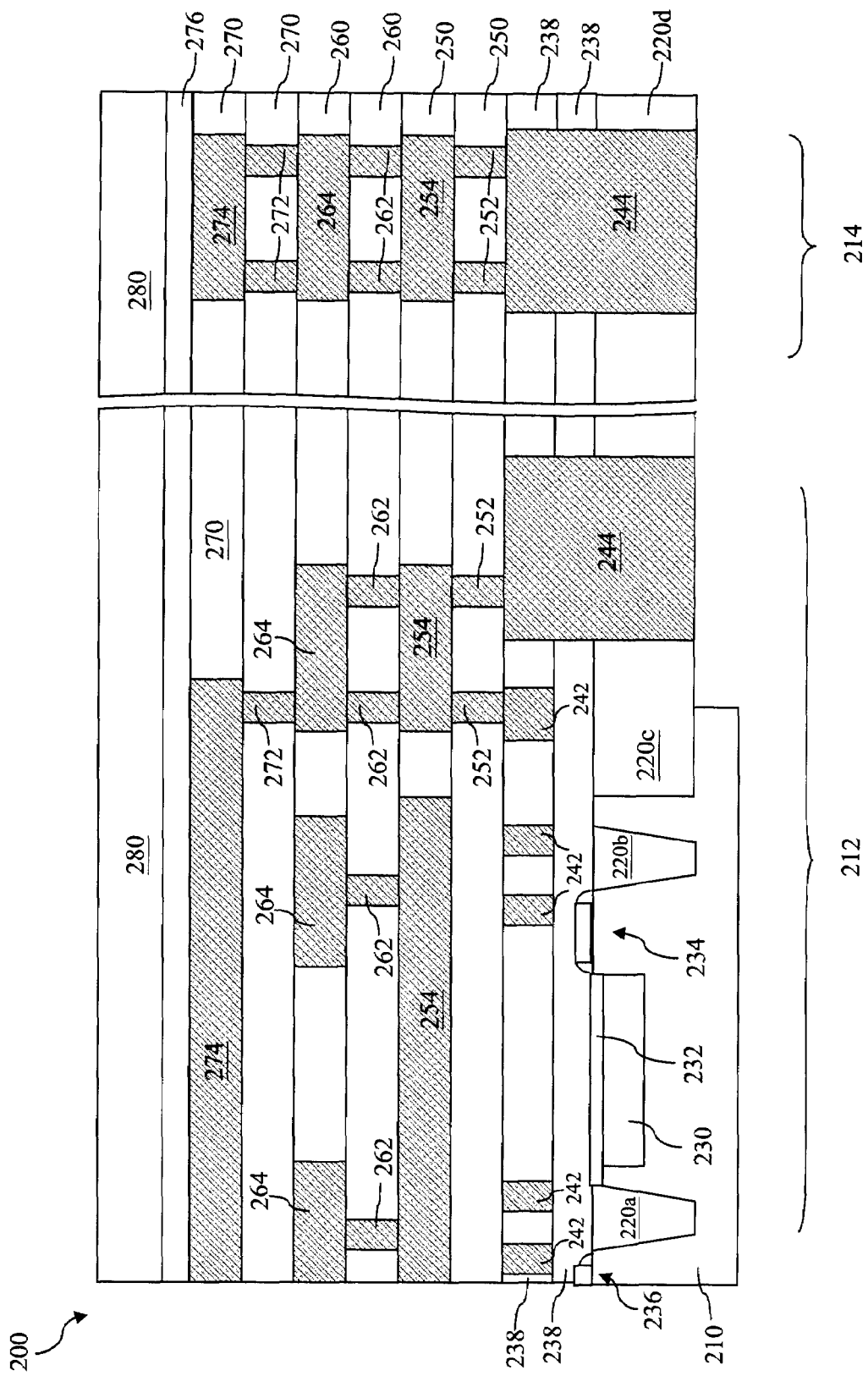

Referring to FIGS. 1 and 9, the method 100 proceeds to step 116 by opening the bonding pads 244. The back side of the first substrate 210 is patterned to form openings to expose the bonding pads. A series of processing steps including photolithography patterning and etching known in the art may be implemented to form the openings to expose the bonding pads.

Figure 10:
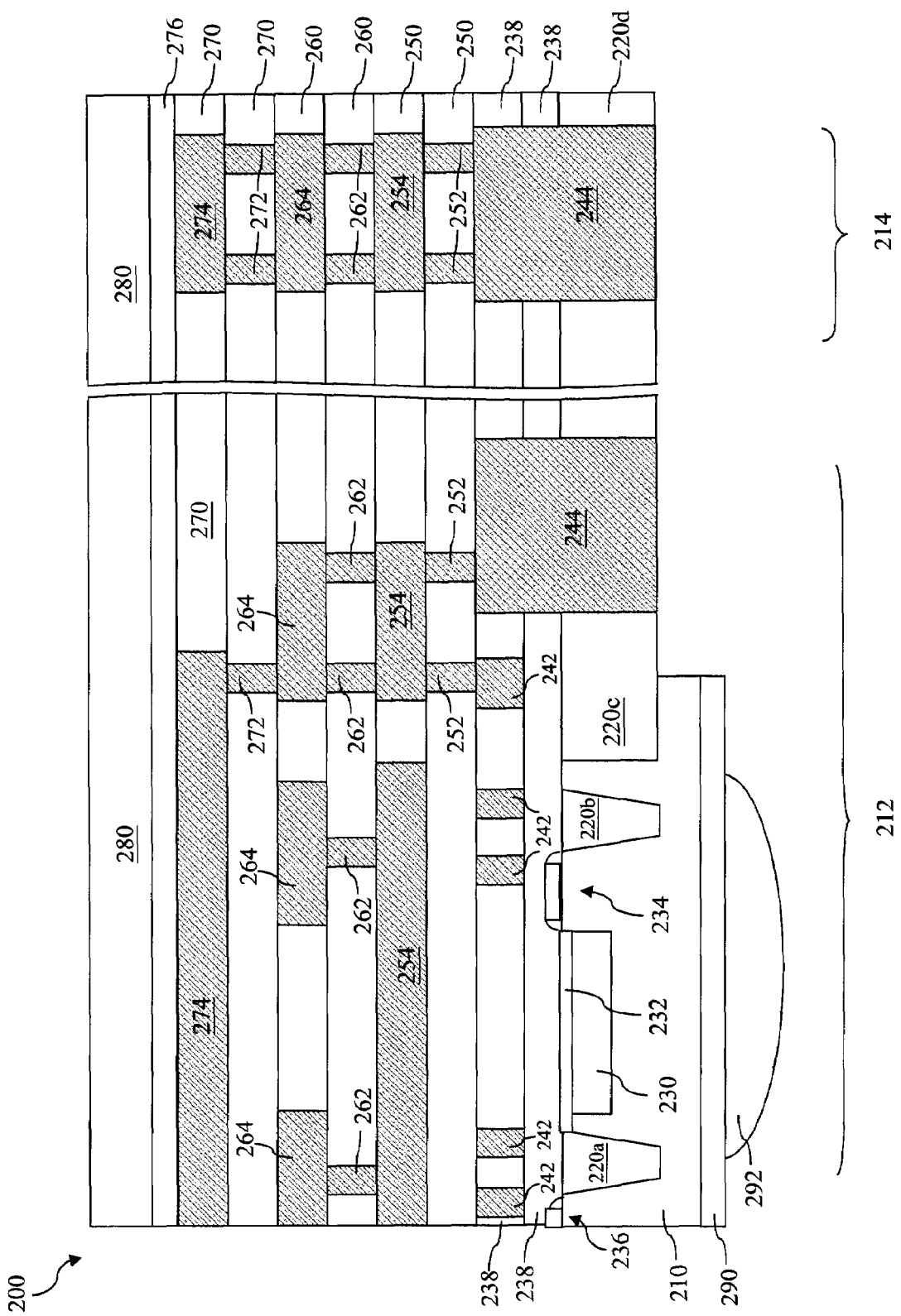

Referring to FIGS. 1 and 10, the method 100 proceeds to step 118 by forming other features to the integrated circuit 200. For example, color filter 290 and micro-lens 292 are formed on the backside of the first substrate 210 and aligned with the imaging sensing element such as the doping regions 230 and 232 for proper imaging effect. The color filter 290 is under the imaging sensing element and the back surface of the first substrate 210 for color imaging applications. The micro-lens 292 is under the imaging sensing element and the back surface of the first substrate 210, or under the color filter 290 and the back surface, such that the backside-illuminated light can be focused on the light-sensing regions. Other proper features may be additionally or collectively formed on the backside of the first substrate 210. For example, the anti-reflective layer of transparent material such as silicon oxide, silicon nitride, silicon oxynitride, or combinations is formed on the back side of the first substrate 210 to cover and protect the back surface without blocking light toward the imaging sensing element and enhance photo sensitivity.

In conventional practice, the bonding pads are formed on the top metal layer and interposed between the bonded second substrate 280 and the multilayer interconnects of the first substrate 210. Thus formed bonding pads are difficult to be accessible for testing, wiring and packaging. The disclosed bonding pads structure and the method making the same provide bonding pads at least partially embedded in trench isolation structures and can be easily exposed through the bonding pad openings for various wafer level testing, yield sorting, wiring and chip packaging. The bonding pads may be further partially embedded in the interlayer metal and dielectric structure to be coupled with the multilayer interconnects. The disclosed bonding pad structure provides flexibility and effectiveness for wafer level testing and yield sorting. The disclosed structure may provide planar or shallow profile of metal pads for wiring bonding in chip level packaging and higher thickness of the bonding pads for sidewall contact to enhance electrical performance and reliability for wafer level or/and chip size package.

Figure 11:
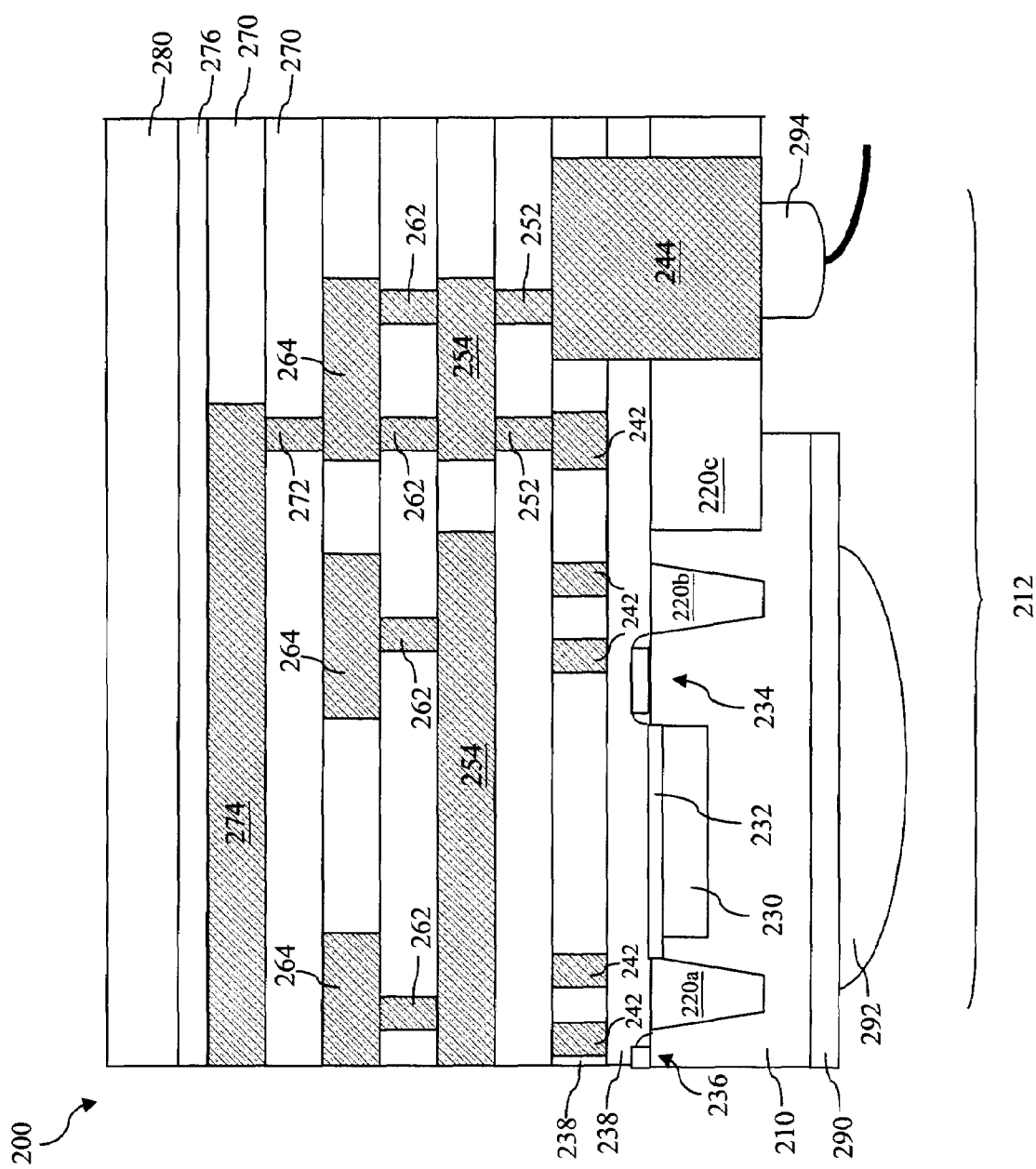
FIGS. 11 and 12 illustrate sectional views of an integrated circuit in various embodiments, constructed according to aspects of the current disclosure.

FIG. 11 illustrates a sectional view of an integrated circuit in one embodiment constructed according to aspects of the present disclosure. The integrated circuit 200 formed between the first and second substrates (210 and 280) is scribed to form various circuit die. Each die is further may be wired to a chip package using various wire bonding techniques such as thermocompression bonding or thermosonic bonding, resulting in a ball or wedge bond 294. Other bonding techniques may be alternatively utilized. During wafer level testing, probe test technique may be used to contact the exposed bonding pads directly by the testing probes for various electric evaluations.

Figure 12:
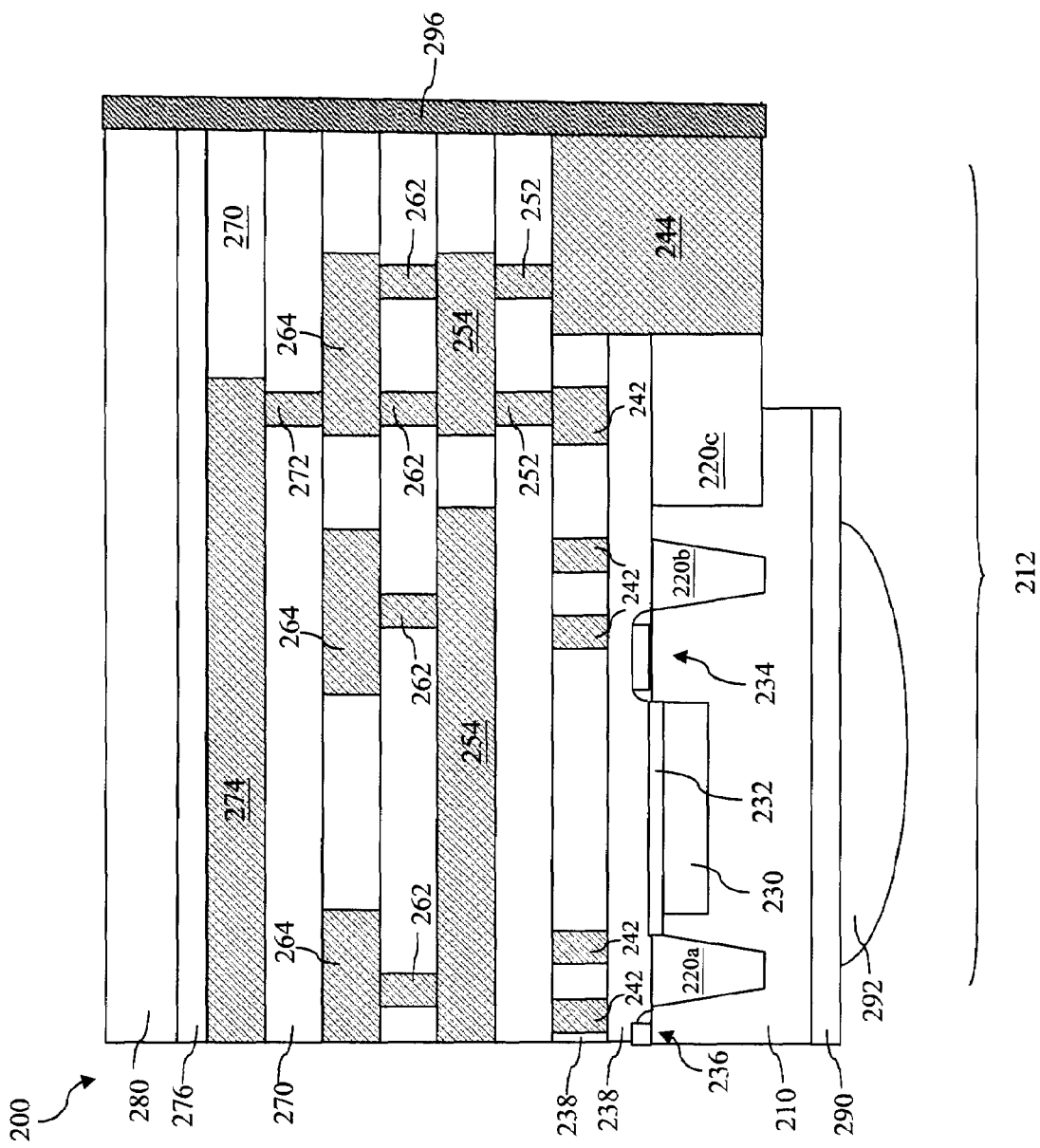

FIG. 12 illustrates a sectional view of an integrated circuit in another embodiment constructed according to aspects of the present disclosure. A deep metal wall 296 is formed to make side contact to the bonding pads 244. The deep metal wall can be formed by a damascene technique or other proper methods. The deep metal wall 296 may have a thickness more than about 8000 angstrom to contact with bonding pad 244 for wafer level or/and chip size packaging (CSP). In this configuration, the bonding pads 244 may be vertically extended up to any proper metal level such that the side contact can have enough contact area to ensure electrical performance and reliability.

Among various embodiments, the present method and structure provides an enhanced capability of wire bonding or chip size packaging. The disclosed structure and method may have various embodiments, modifications and variations. In one example, the first substrate may include various MOS transistor and integrated circuit devices and features. The formation of the bonding pads may be partially integrated with the formation of the various multilayer interconnect features. The bonding pads may be designed and disposed in test regions (border regions) of a die. The imaging sensors can be formed as an array and positioned in the center region of the die. The color filters and micro-lenses are formed on the first substrate after proper planarization such as CMP, etching back, or a combination thereof. The bonding pads may include other proper bonding materials known in the art or future identified/developed proper materials. A transparent material layer such as a silicon oxide layer may be formed on the back side of the first substrate 210 to cover and protect the micro-lenses and color filters. The anti-reflective layer of transparent material such as silicon oxide, silicon nitride, silicon oxynitride, or combinations may be formed on the back side of the first substrate 210 to enhance photo sensitivity. The formation of the bonding pads and the multilayer interconnects may have different variation and be in different sequences when the bonding pads are extended to different metal levels and/or use different conductive materials. The opening of the bonding pads may be implemented after the formation of the color filters and the micro-lenses for chip packaging.

In the disclosed backside illuminated imaging sensor, the illuminated light during applications may not be limited to visual light beam, it can be extended to other optical light such as infrared (IR) and ultraviolet (UV), and other proper radiation beam. Accordingly, the various isolation features may be properly chosen and designed to effectively reflect and/or pass the corresponding radiation beam. Various sensing features and other functional features may be properly chosen and designed to effectively sense the corresponding radiation beam.

Thus, the present disclosure provides a microelectronic device. The microelectronic device includes a sensing element formed in the semiconductor substrate, a trench isolation feature formed in the semiconductor substrate, a bonding pad formed at least partially in the trench isolation feature, and interconnect features formed over the sensing element and the trench isolation feature. The interconnect features are coupled to the sensing element and the bonding pad and isolated from each other by interlayer dielectric.

In the disclosed microelectronic device, the sensing element may include an imaging sensor feature. The bonding pad may be extended vertically to a surface of the trench isolation feature and being coplanar with the trench isolation feature. The bonding pad may be extended vertically up to the interlayer dielectric. The trench isolation may have a thickness ranging between about 2000 angstrom and about 6 micron. The bonding pad may include a horizontal dimension ranging between about 20 micron and about 200 micron. The bonding pad may be configured within the trench isolation feature when viewed in a direction perpendicular to the semiconductor substrate. In various embodiments, the microelectronic device may further include a passivation layer formed on the interconnect features. The microelectronic device may further include a carrier substrate bonded to the semiconductor substrate such that the interconnect features are interposed between the semiconductor substrate and the carrier substrate. The microelectronic device may further include at least one of a color filter and a microlens formed on the semiconductor substrate, aligned with the sensing element, and disposed on a opposite surface of the semiconductor substrate relative to the interconnect features.

The present disclosure also provides a method for making an integrated circuit. The method includes providing a semiconductor substrate having a front surface and a back surface, forming a sensing element on the front surface of the semiconductor substrate, forming a trench isolation feature on the front surface of the semiconductor substrate, forming a bonding pad at least partially in the trench isolation, and forming interconnect features over the sensing element and trench isolation feature. The interconnect features are configured to be coupled with the sensing element and the bonding pad.

In various embodiments, the method may further include bonding a carrier substrate to the front surface of the semiconductor substrate such that the interconnect features are interposed between the semiconductor substrate and the carrier substrate. The method may further include forming a passivation layer on the interconnect features of the semiconductor substrate before the bonding of the carrier substrate. The method may further include thinning down the semiconductor substrate from the back surface of the interconnect features. The method may further include opening the semiconductor substrate from the back surface thereof to expose the bonding pad. The method may further include forming a color filter and a microlens on the back surface of the semiconductor substrate. The forming of the trench isolation feature may include etching the semiconductor substrate to form a trench therein; filling the trench with a dielectric material; and planarizing the semiconductor substrate. The forming of the bonding pad may include etching the trench isolation feature to form a trench opening; and filling a conductive material in the trench opening. The filling of the conductive material in the trench opening may include filling aluminum.

The present disclosure also provide a semiconductor device. The semiconductor device includes a microelectronic circuit element formed in a semiconductor substrate, a shallow trench isolation formed in the semiconductor substrate, a bonding pad formed at least partially in the shallow trench isolation, and interconnects formed over the microelectronic device and the shallow trench isolation.

In the disclosed semiconductor device, the bonding pad may include a conductive material such as aluminum, copper, tungsten, metal nitride, and/or metal silicide. The bonding pad may be exposed from a surface of the semiconductor substrate opposite the interconnects. The bonding pad may be exposed from a sidewall of the semiconductor substrate after dicing. The microelectronic circuit element comprises an imaging sensor element. The microelectronic circuit element may include a pinned photodiode. The bonding pad is isolated from the microelectronic circuit element by the shallow trench isolation.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronic device comprising:
a sensing element formed in a semiconductor substrate;
a trench isolation feature formed in the semiconductor substrate;
a bonding pad formed at least partially in the trench isolation feature;
interconnect features formed over the sensing element and the trench isolation feature, coupled to the sensing element and the bonding pad. and isolated from each other by interlayer dielectric; and
at least one of a color filter and a microlens formed on the semiconductor substrate, aligned with the sensing element, and disposed on a opposite surface of the semiconductor substrate relative to the interconnect features.

2. The device of claim 1, wherein the sensing element comprises an imaging sensor feature.

3. The device of claim 1, wherein the bonding pad is extended vertically to a surface of the trench isolation feature and being coplanar with the trench isolation feature.

4. The device of claim 1, wherein the bonding pad is extended vertically up to the interlayer dielectric.

5. The device of claim 1, wherein the trench isolation comprises a thickness ranging between about 2000 angstrom and about 6 micron.

6. The device of claim 1, wherein the bonding pad comprises a horizontal dimension ranging between about 20 micron and about 200 micron.

7. The device of claim 1, wherein the bonding pad is configured within the trench isolation feature when viewed in a direction perpendicular to the semiconductor substrate.

8. The device of claim 1, further comprising a passivation layer formed on the interconnect features.

9. The device of claim 1, further comprising a carrier substrate bonded to the semiconductor substrate such that the interconnect features are interposed between the semiconductor substrate and the carrier substrate.

10. A device comprising:
a semiconductor substrate having a front surface and a back surface;
a sensing element on the front surface of the semiconductor substrate;
a trench isolation feature on the front surface of the semiconductor substrate;
a bonding pad at least partially in the trench isolation feature;
interconnect features over the sensing element and trench isolation feature, configured to be coupled with the sensing element and the bonding pad;
a passivation layer on the interconnect features of the semiconductor substrate, the passivation layer configured so that a carrier substrate can be bonded to the front surface of the semiconductor substrate such that the interconnect features are interposed between the semiconductor substrate and the carrier substrate; and
an anti-reflective layer, a color filter and a microlens on the back surface of the semiconductor substrate.

11. The device of claim 10, wherein the semiconductor substrate includes an opening from the back surface thereof to expose the bonding pad.

12. A semiconductor device comprising:
a microelectronic circuit element formed in a semiconductor substrate, wherein the microelectronic circuit element comprises a pinned photodiode;
a shallow trench isolation formed in the semiconductor substrate;
a bonding pad formed at least partially in the shallow trench isolation; and
interconnects formed over the microelectronic circuit element and the shallow trench isolation.

13. The device of claim 12, wherein the bonding pad is isolated from the microelectronic circuit element by the shallow trench isolation.

14. The device of claim 12, wherein the bonding pad comprises a conductive material selected from the group consisting of aluminum, copper, tungsten, metal nitride, metal silicide, and combinations thereof.

15. The device of claim 12, wherein the bonding pad is exposed from a surface of the semiconductor substrate opposite the interconnects.

16. The device of claim 12, wherein the bonding pad is exposed from a sidewall of the semiconductor substrate after dicing.

17. The device of 12, wherein the microelectronic circuit element comprises an imaging sensor element that includes the pinned photodiode.

* * * * *